United States Patent
Hung et al.

(10) Patent No.: US 9,009,566 B2
(45) Date of Patent: Apr. 14, 2015

(54) OUTPUTTING INFORMATION OF ECC CORRECTED BITS

(75) Inventors: Chun-Hsiung Hung, Hsinchu (TW); Hsin Yi Ho, Hsinchu (TW)

(73) Assignee: Macronix International Co., Ltd., Hsinchu (TW)

(*) Notice: Subject to any disclaimer, the term of this patent is extended or adjusted under 35 U.S.C. 154(b) by 25 days.

(21) Appl. No.: 13/612,433

(22) Filed: Sep. 12, 2012

(65) Prior Publication Data

US 2014/0075265 A1   Mar. 13, 2014

(51) Int. Cl.
    *H03M 13/00*     (2006.01)
    *G11C 7/00*     (2006.01)
    *G06F 11/10*     (2006.01)
    *G11C 16/34*     (2006.01)

(52) U.S. Cl.
    CPC .......... *G06F 11/1084* (2013.01); *G11C 16/349* (2013.01)

(58) Field of Classification Search
    CPC ............ G01R 31/31935; G06F 12/0246; G06F 11/0766; G06F 11/1008; G06F 11/3452; G11C 29/52; G11C 29/42; G11C 16/26; G11C 16/3436; G11C 2029/0411
    USPC ................... 714/718, 763, 764, 773
    See application file for complete search history.

(56) References Cited

U.S. PATENT DOCUMENTS

| | | | |
|---|---|---|---|
| 7,596,643 B2 * | 9/2009 | Merry et al. ................ | 710/56 |
| 7,958,430 B1 * | 6/2011 | Kolokowsky et al. ...... | 714/763 |
| 8,239,724 B2 * | 8/2012 | Swing et al. ............... | 714/752 |
| 2009/0070657 A1 * | 3/2009 | Litsyn et al. ............... | 714/773 |
| 2010/0269015 A1 * | 10/2010 | Borchers et al. ............ | 714/758 |
| 2010/0306456 A1 * | 12/2010 | Schmidberger ............. | 711/103 |
| 2012/0110417 A1 * | 5/2012 | D' Abreu et al. ........... | 714/773 |
| 2012/0117303 A1 * | 5/2012 | Carannante et al. ........ | 711/103 |
| 2012/0221924 A1 * | 8/2012 | Flynn et al. ................ | 714/763 |
| 2012/0246545 A1 * | 9/2012 | Lin et al. .................... | 714/773 |
| 2013/0055047 A1 * | 2/2013 | Sharon et al. .............. | 714/764 |

OTHER PUBLICATIONS

Hakyong Lee; Sanghyuk Jung; Yong Ho Song; , "PCRAM-assisted ECC management for enhanced data reliability in flash storage systems," Consumer Electronics, IEEE Transactions on , vol. 58, No. 3, pp. 849-856, Aug. 2012.*
ST Microelectronics Application Note AN1819, "Bad Block Management in NAND Flash Memories," 2004, 7pp.

(Continued)

*Primary Examiner* — Cynthia Britt
(74) *Attorney, Agent, or Firm* — Haynes Beffel & Wolfeld LLP

(57) ABSTRACT

The present invention provides a method of operating a memory device storing error correcting codes ECCs for corresponding data and including ECC logic to correct errors using the ECCs. The method includes correcting data using ECCs for the data on the memory device, and producing information on the memory device about the use of the ECCs. The method provides the ECC information on an output port of the device in response to a command received on an input port from a process external to the memory device. The present invention also provides a method of controlling a memory device. The method includes sending a command to the memory device requesting ECC information corresponding to data in the memory device, and receiving the ECC information from the memory device in response to the command. The method includes performing a memory management function using the ECC information.

18 Claims, 8 Drawing Sheets

(56) References Cited

OTHER PUBLICATIONS

Macronix Int'l Co., Ltd. data sheet, "MX30LF1208AA—512M-bit NAND flash Memory," Jun. 2012, 48pp.

Wikipedia, "Logical address," Mar. 2013, 2pp (taken from Free Online Dictionary of Computing prior to Nov. 1, 2008).
Wikipedia, "Wear leveling," 5pp (last modified Feb. 28, 2013).

* cited by examiner

HEX Command Table

| COMMANDS | First Cycle | Second Cycle |
|---|---|---|
| Read Mode | 00H | 30H |
| Random Data Input | 85H | - |
| Random Data Output | 05H | E0H |
| Cache Read Begin | 00H | 31H |
| Cache Read End | 34H | - |
| Read ID | 90H | - |
| Reset | FFH | - |
| Read Status | 70H | - |

FIG. 7A (Prior Art)

New Commands

| COMMANDS | First Cycle | Second Cycle |
|---|---|---|
| ECC Read Mode | 08H | 38H |
| ECC Random Data Output | 0DH | E8H |
| ECC Cache Read Begin | 08H | 39H |
| ECC Cache Read End | 3CH | - |

FIG. 7B

OUTPUTTING INFORMATION OF ECC CORRECTED BITS

BACKGROUND OF THE INVENTION

1. Field of the Invention

The present invention relates to memory devices and systems including error correction code (ECC) logic.

2. Description of Related Art

Memory technologies used for integrated circuit memories are being developed at smaller and smaller technology nodes, and are being deployed on larger and larger memory arrays on a single integrated circuit. As the technology for memory cells advances, the margins for sensing the data can become tighter. Also, the ability of the memory cells to hold data values in the presence of disturbance of the memory cell state caused by high speed and high volume accesses to the memory cells and to neighboring memory cells can be limited by the tighter margins.

To address issues like those that arise from tighter margins and memory cell disturbance, as these technologies scale in size and density, use of error correcting codes (ECCs) embedded with integrated circuit memory has become more widespread. In addition to correcting erroneous memory bits in a memory device, ECC information that may be produced in the process of correcting may be used for memory management functions. The memory management functions may include bad block management, re-mapping, refreshing, and wear leveling.

For example, a memory controller may base its decision on whether to refresh a certain page in the memory device on the ECC information for the page. However, when the ECC logic that corrects erroneous memory bits is embedded in the integrated circuit memory, the ECC information is not easily available to the memory controller that is external to the integrated circuit memory. ECC corrected data alone does not include the ECC information, such as which bits have been corrected or how many bits have been corrected. So, in an environment in which only ECC corrected data is provided to the memory controller, information needed about the use of the ECC codes that can be used in memory management functions may not be available.

It is desirable to provide a solution for providing the ECC information to a memory controller external to the integrated circuit memory, such that the memory controller can perform memory management functions with necessary ECC information.

SUMMARY OF THE INVENTION

The present invention provides a method of operating a memory device storing error correcting codes ECCs for corresponding data and including ECC logic to correct errors using the ECCs. The method includes correcting data using ECCs for the data on the memory device, and producing information on the memory device about the use of the ECCs. The method provides the ECC information on an output port of the device in response to a command received on an input port from a process external to the memory device. The present invention also provides a method of controlling a memory device. The method includes sending a command to the memory device requesting ECC information corresponding to data in the memory device, and receiving the ECC information from the memory device in response to the command. The method includes performing a memory management function using the ECC information.

Other aspects and advantages of the present invention can be seen on review of the drawings, the detailed description and the claims, which follow.

BRIEF DESCRIPTION OF THE DRAWINGS

FIG. 7A illustrates an example command table according to prior art.

FIG. 7B illustrates a table of example new commands in one implementation of the present technology.

DETAILED DESCRIPTION

A detailed description of embodiments of the present invention is provided with reference to the FIGS. 1-9.

As used in the present application, a bit is the basic unit of digital data in the memory array. A bit can have only two possible values: either digital one (1) or zero (0). A byte is a unit of digital data in the memory array. A byte may contain multiples of bits, such as 8 bits. A word is a unit of digital data in the memory array. A word may contain multiples of bytes, such as 4 bytes or 8 bytes corresponding to 32 bits, or 64 bits if a byte has 8 bits. A page is the basic set of data that is stored in the memory array arranged to be read in response to a single read command. A page may have a fixed size such as 2,112 bytes where each byte has 8 bits. A block is a set of data stored in a sector or segment of the memory array, where the block may be a page, multiples of pages, or other size of data. The block may have a size selected according to the memory management process being applied rather than according to the size of data read in response to a single read command.

Figure 1:
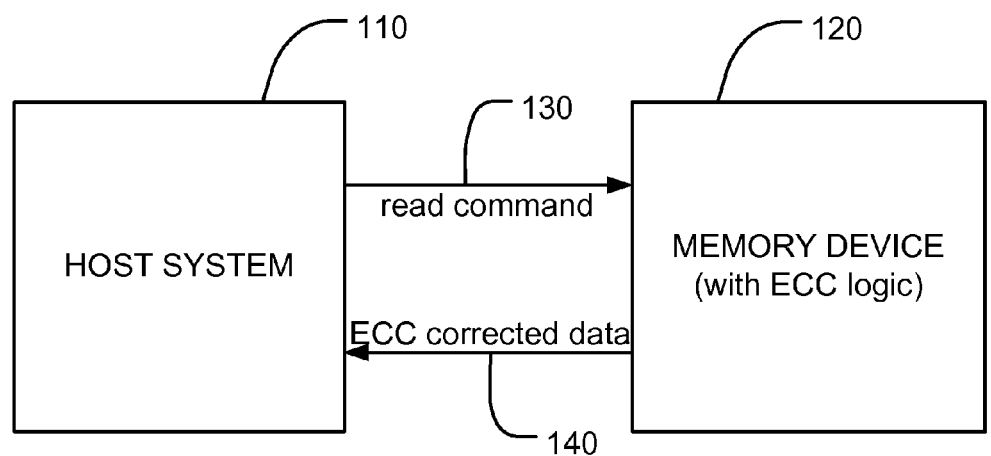
FIG. 1 is a simplified diagram illustrating a host system external to a memory device with internal ECC logic, according to prior art.

FIG. 1 is a simplified diagram illustrating a host system 110 external to a memory device 120, according to prior art. The memory device 120 stores error correcting codes ECCs for corresponding data, and includes ECC logic to correct errors using the ECCs. The host system 110 includes programs or other logic that uses a command set, such as a read command 130 requesting ECC corrected data from the memory device 120. The memory device 120 provides ECC corrected data 140 to the host system 110 in response to the read command 130. However, the host system 110 does not request and the memory device 120 does not provide ECC information that may be produced in the process of correcting error bits by the ECC logic inside the memory device 120. Consequently, the host system 110 is not able to use ECC information to perform memory management functions such as bad block management, re-mapping, refreshing, and wear leveling, using the ECC information.

Figure 2:
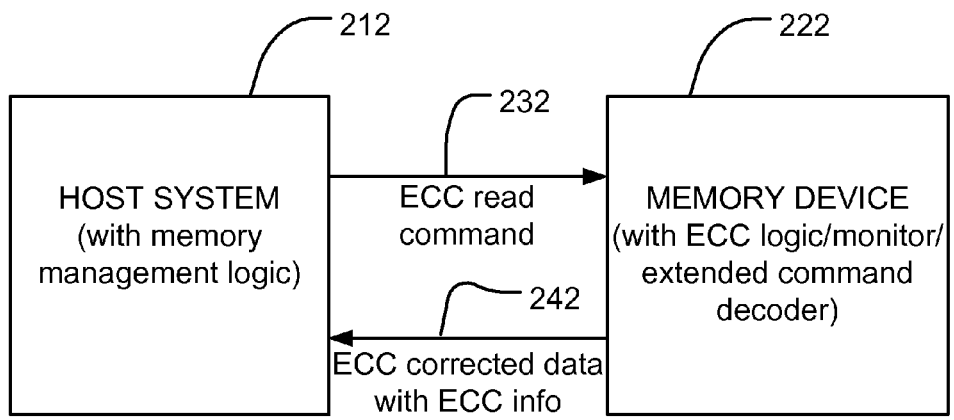
FIG. 2 is a simplified diagram illustrating a host system external to a memory device, where the memory device provides ECC corrected data along with corresponding ECC information.

FIG. 2 is a simplified diagram illustrating a host system 212 external to a memory device 222, as described herein. The memory device 222 stores error correcting codes ECCs for corresponding data, and includes ECC logic to correct errors using the ECCs. The host system 212 includes programs or other logic that use an extended command set, such as command 232, designated "ECC read" in the drawing, requesting ECC corrected data from the memory device 222, along with ECC information such as a count of the number of corrected errors in the data being read. The memory device 222 provides ECC corrected data 242 along with the requested ECC information to the host system 212 in response to the command 232. Consequently, the host system 212 is enabled to use ECC information to perform memory management functions such as bad block management, re-mapping, refreshing, and wear leveling, using the ECC information. To support this extended command set, the memory device 222 includes logic to monitor ECC logic functions and gather ECC information, such as error counts or other statistics, to be used by the host.

Examples of ECC statistics that can be gathered by monitoring ECC logic include counts of ECC detected single-bit errors, counts of ECC detected multi-bit errors, counts of ECC detected stuck bit errors, counts of ECC detected repeating errors, counts of ECC detected non-repeating errors, counts of ECC detected row failures, and counts of ECC detected column failures in corresponding data. The ECC statistics can include counts of ECC corrected single-bit errors, counts of ECC corrected multi-bit errors, counts of ECC corrected repeating errors, counts of ECC corrected non-repeating errors, counts of errors not correctible by ECC in corresponding data.

The ECC logic on the memory device 222 can support any suitable ECC scheme. Representative ECC schemes include Hamming code, extended Hamming code, multi-dimensional parity-check code, Reed-Solomon code, BCH code (Bose-Chaudhuri-Hocquenghem), Turbo code, and low-density parity-check code. The length of the error correcting code ECC associated with a particular data set depends on 3 factors: (1) ECC scheme; (2) Maximum corrected bit number; (3) Data length of one page. The BCH code is a class of cyclic error-correcting codes that can correct multiple bit errors. For example, to provide maximum corrected bit number of 40 bits in a page of 8 Kilo-bits of data, the length of the BCH ECC code is 560 bits. For another example, to provide maximum corrected bit number of 24 bits in a 8 Kilo-bits page, the length of the BCH ECC code is 336 bits.

Figure 3:
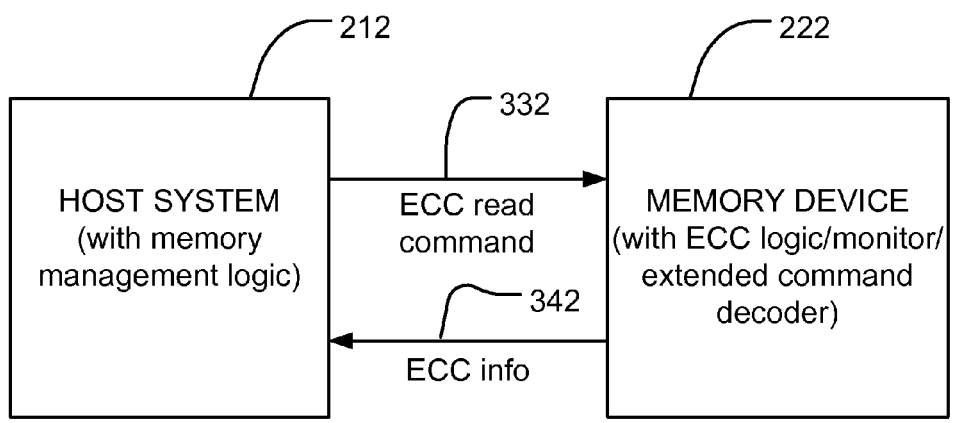
FIG. 3 is a simplified diagram illustrating a host system external to a memory device, where the memory device provides ECC information without corresponding ECC corrected data.

FIG. 3 is a simplified diagram illustrating a host system 212 external to a memory device 222 like those in FIG. 2, and in which like elements have like reference numerals and are not described again. The command 332 may request ECC information 342, and the memory device 222 may provide the ECC information 342 without the corresponding ECC corrected data.

Figure 4:
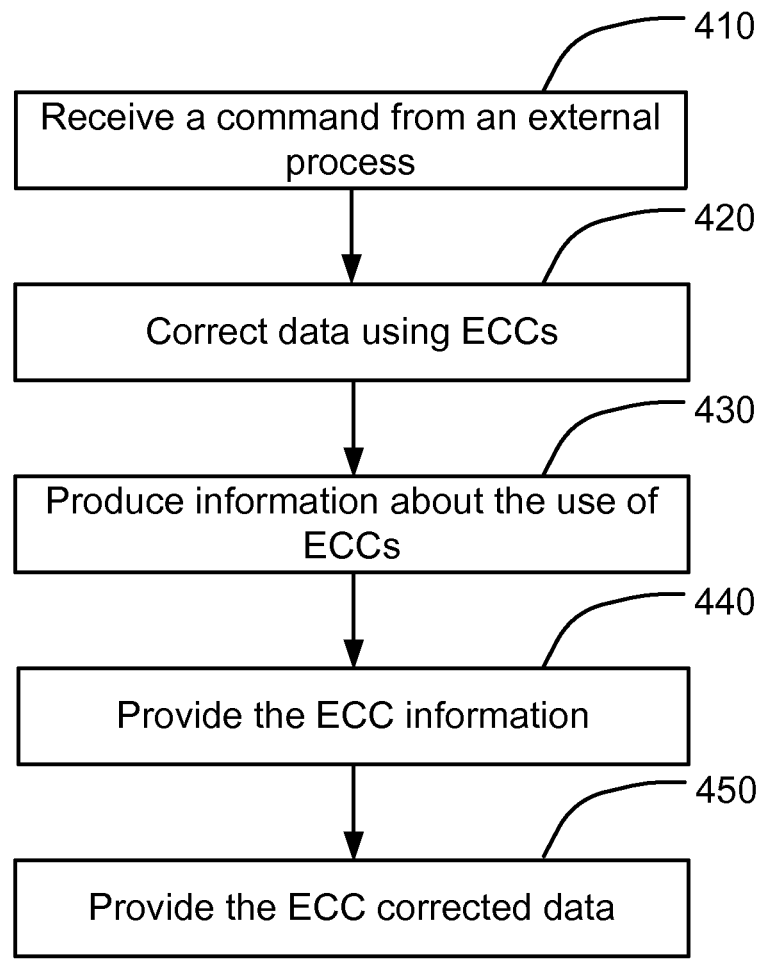
FIG. 4 is a flowchart illustrating a method of operating a memory device, associated with providing ECC information.

FIG. 4 is a flowchart illustrating a method of operating a memory device, associated with providing ECC information. The flowchart shows steps executed by the memory device, associated with providing ECC information. The memory device stores error correcting codes ECCs for corresponding data and includes ECC logic to correct errors using the ECCs. A first step includes receiving a command received on an input port from a process external to the memory device (410). A second step includes correcting data using ECCs for the data on the memory device (420). The data may be addressed by addresses received by the memory device in coordination with the command in a random read, or by addresses generated by an address counter in a sequential read. A third step includes producing information on the memory device about the use of the ECCs (430). The second step includes correcting data and the third step, including producing ECC information, may be performed in response to the command. A fourth step includes providing the ECC information on an output port of the memory device in response to the command received on an input port from a process external to the memory device (440). The command requests ECC information produced by the ECC logic corresponding to the data. A fifth step includes providing the ECC corrected data, if the command requests ECC corrected data in addition to the ECC information (450).

The ECCs are associated with corresponding ECC pages of data, and information about the use of the ECC comprises a count of the number of bits corrected using the ECC for a corresponding ECC page.

The command may be a read command for reading a block of data associated with at least one ECC for detecting and correcting errors in the block of data. The command may be a read command for reading multiple blocks of data each associated with at least one error correcting code ECC for detecting and correcting errors in the associated block of data.

The ECC information may include ECC statistics about results from executing the ECC logic using ECCs on corresponding data. Examples of ECC statistics are described in connection with FIG. 2. The ECC information may be stored in a register on the memory device. The command may be a read command for reading the ECC information stored in the register.

Figure 5:
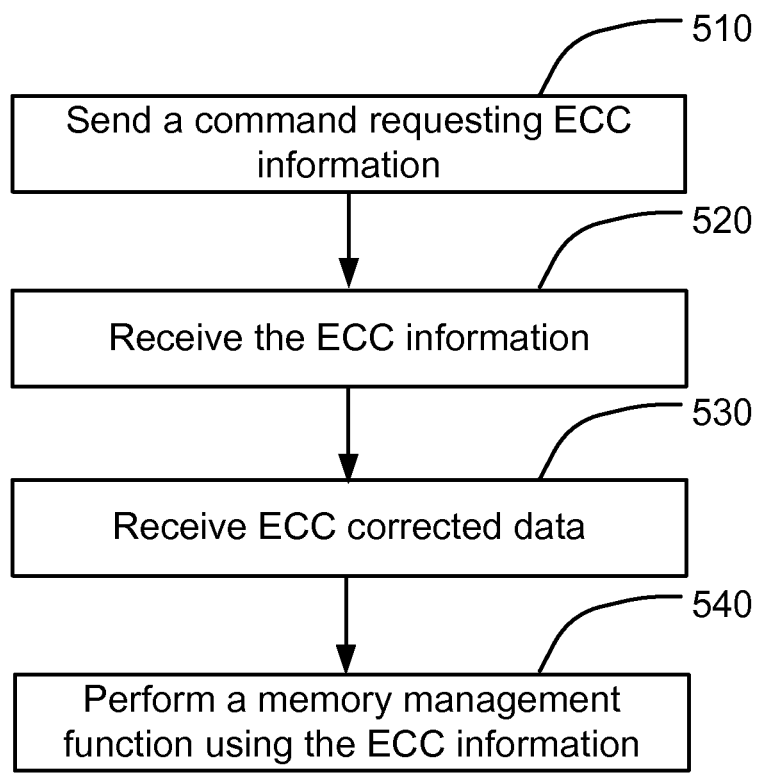
FIG. 5 is a flowchart illustrating a method of controlling a memory, associated with receiving ECC information.

FIG. 5 is a flowchart illustrating a method of controlling a memory, associated with receiving ECC information. A first step includes sending a command to a memory device requesting ECC information corresponding to data in the memory device (510). The memory device stores error correcting codes ECCs for the corresponding data and includes ECC logic to correct errors using the ECCs. The command may request ECC corrected data in addition to the ECC information. A second step includes receiving the ECC information from the memory device in response to the command (520). A third step includes receiving ECC corrected data in addition to the ECC information, if the command requests the ECC corrected data (530). A fourth step includes performing a memory management function using the ECC information (540).

The command may be a read command for reading a block of data associated with at least one error correcting code ECC for detecting and correcting errors in the block of data. The ECC information may include ECC statistics about results from executing the ECC logic using ECCs on corresponding data. The memory device may be an integrated circuit. The method may be implemented in a separate integrated circuit in communication with the memory device. The method may be implemented using a computer program executed by a processor in communication with the memory device.

The memory management function using the ECC information may include mapping physical addresses of the memory device to logical addresses used by an operating system of a host processor, copying data at a range of logical addresses from a first range of physical addresses to a second range of physical addresses, marking blocks or data with numbers of error bits, detecting blocks of data with numbers of error bits greater than a threshold, or selecting a block for writing new data. The memory management function using the ECC information may be used for tasks such as bad block management, re-mapping, refreshing, and wear leveling.

Figure 6:
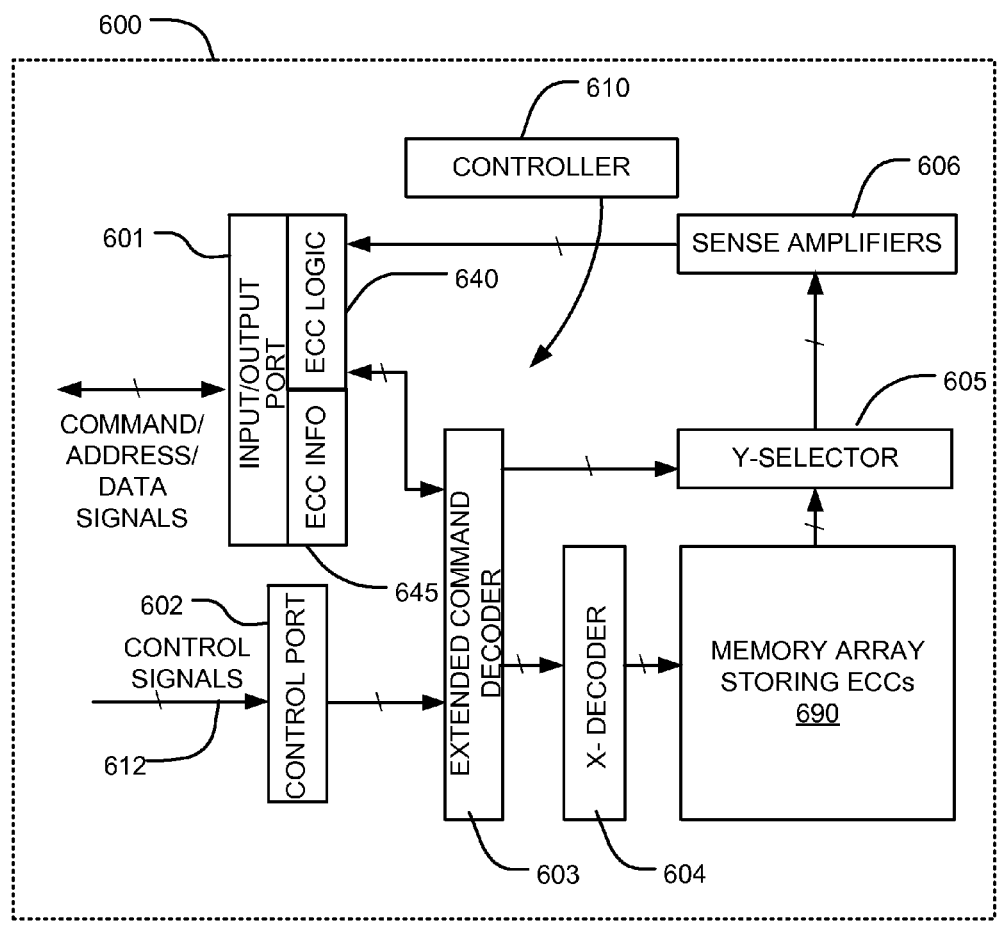
FIG. 6 is a block diagram of a memory device providing ECC information in response to a command received on an input port.

FIG. 6 is a block diagram of a memory device 600 including a memory array 690 storing error correcting codes ECCs for corresponding data. The memory device 600 also includes ECC logic 640 to detect and correct errors in the corresponding data using the ECCs, and a controller 610 coupled to the memory array 690 and the ECC logic 640. The controller 610 includes control logic coupled to the memory array 690 and the ECC logic 640 to provide ECC information 645 for corresponding data on an output port of the memory device in response to a command on an input port of the memory device 600. A block of data in the memory device 600 is associated with at least one error correcting code ECC.

The memory device 600 includes an input/output port 601, and a control port 602. The control port 602 includes circuits that receive control signals 612 in communication with external devices, including such control signals as chip enable signals, read enable signals, write enable signals, command enable signals, address enable signals, clock signals, etc. The input/output port 601 functions as the input port or the output port of the memory device 600, depending on values of the control signals 612 received at the control port 602. The input/output port 601 includes circuits that receive input signals and transmit output signals. The input signals may include command signals, address signals, and input data signals. The output signals may include the ECC information and the ECC corrected data.

The control logic provides ECC corrected data on an output port of the memory device 600 in addition to the ECC information. The control logic enables the ECC logic to produce corrected data in addition to the ECC information in response to the command. The ECCs are associated with corresponding ECC pages of data, and information about the use of the ECC includes a count of the number of bits corrected using the ECC for a corresponding ECC page.

The command on the input port of the memory device 600 may be a read command for reading a block of data associated with at least one ECC for detecting and correcting errors in the block of data. The command may also be a read command for reading multiple blocks of data each associated with at least one error correcting code ECC for detecting and correcting errors in the associated block of data.

The control logic may further include logic to store ECC information in a register on the memory device. The command may be a read command for reading the ECC information in the register.

An extended command decoder 603 is coupled to the input/output port 601, and the control port 602, which detects and causes execution of commands for operating the memory device 600, including read commands and write commands. Write commands are called, or can include, program and erase commands in some technologies. The extended command decoder 603 is in turn coupled with a row decoder (X-decoder) 604 and a column selector (Y-selector) 605 for access to the memory array 690. Sense amplifiers 606 are coupled to the memory array 690 via the column selector 605.

The controller 610 can include one or more state machines, register files, and other logic circuitry that are deployed to execute the functions of the memory, including the read and write functions. The controller 610 can be implemented using one or more dedicated logic circuits, programmable gate array circuits, a programmable processor with associated software, or combinations of these types of circuits. In some implementations, parts of the controller functionality can be implemented off of the memory device 600, in hardware or software associated with the memory controller or a host processor for example.

The memory device 600 also includes the ECC logic 640, illustrated as coupled with the input/output port 601, and the ECC information 645 in this example. During a write operation, addressing a block of data in the memory array 690, the ECC logic 640 computes an ECC code to be stored in association with the block of data. During a read operation addressing a block of data in the memory array 690, the data from the addressed block and the stored ECC code for the block is read from the memory array 690. The ECC logic 640 detects whether the addressed block of data contains any errors, and whether the detected errors can be corrected. The number of errors and whether the errors can be corrected in the error checked block of data in a given implementation depends on the type of ECC code utilized. If the error can be corrected, then the corrected data from the ECC logic 640 may be combined with the data from the addressed block, and provided as output.

FIG. 7A illustrates an example command table 710 for an example prior art memory device including embedded ECC logic, providing ECC corrected data, but not providing ECC information about the use of the ECCs. The table is described herein not as a limitation to for the present application, but as a contrast with new commands for the present application described in connection with FIG. 7B.

The example command table 710 includes three read commands to read data out of a memory device. Each command includes a first cycle including two hexadecimal digits, and may include a second cycle including two other hexadecimal digits. The first read command is "Read Mode" that includes a first cycle 00H and a second cycle 30H, where H indicates a hexadecimal value. In operation, a memory controller sends the first cycle 00H of the first read command to the memory device, the row and column addresses, and the second cycle 30H, in order. When the memory device becomes ready after confirming the second cycle 30H, the memory controller can read out data from the memory device in sequence.

The second read command is "Random Data Output" that includes a first cycle 05H and a second cycle E0H. In operation, the memory controller sends the first cycle 05H of the second read command to the memory device, the column address, and the second cycle E0H, in order. When the memory device becomes ready after confirming the second cycle E0H, the memory controller can randomly read out data within a page from the memory device.

The third read command is "Cache Read Begin" in conjunction with "Cache Read End." The "Cache Read Begin" command includes a first cycle 00H and a second cycle 31H. The "Cache Read End" command includes a first cycle 34H without a second cycle. In operation, the memory controller sends the first cycle 00H to the memory device, the row and column addresses for start page selection, and the second cycle 31H, in order. When the memory device becomes ready after confirming the second cycle 31H, the memory controller can read out data from the memory device in sequence for multiple pages. The memory controller sends the first cycle 34H of the "Cache Read End" command to end the cache read operation.

However, the data read out of the memory device with the three commands described above does not include ECC information corresponding to any operations performed by the ECC logic embedded in the memory device. As such, the memory controller cannot perform any memory management functions including bad block management, re-mapping, refreshing, wear leveling, etc., based on the ECC information about the use of the ECCs for the page, because the ECC information is not easily available to the memory controller.

FIG. 7B illustrates a table 720 of new commands in one implementation of the present technology, for an example memory device including embedded ECC logic, and providing ECC information about the use of the ECCs to devices external to the memory device. Each command in the table 720 is received on an input/output port such as the input/output port 601 of the memory device 600 described in FIG. 6. The table 720 of new commands includes three read commands to request ECC information from a memory device that stores error correcting codes ECCs for corresponding data. The three read commands are for three different contexts under which data is read out of the memory device. Each command includes a first cycle including two hexadecimal digits, and may include a second cycle including two other hexadecimal digits. Values for the new commands are unique to other commands in a same command set supported by the memory device. Values in the table 720 are for illustration purposes only, and do not limit the present application. Further, the commands are not limited to a first cycle and a second cycle. For a particular memory device implementing the present application, there may be one or more cycles and/or one or more binary/hexadecimal digits per cycle for each command.

The memory device provides the ECC information in response to a read command such as those described herein for the present application. The ECC information is produced by ECC logic corresponding to data in the memory device. The ECC information contains a number of bits, such as 64 bits. The ECC information may include counts of ECC corrected bits corresponding to blocks of data, and the counts may be stored in registers corresponding to blocks of data. The memory device may provide ECC corrected data with the ECC information.

The first read command is "ECC Read Mode" that includes a first cycle 08H and a second cycle 38H. In operation, a memory controller sends the first cycle 08H of the first read command to the memory device, the row and column addresses, and the second cycle 38H, in order. When the memory device becomes ready after confirming the second cycle 38H, the memory controller can read out the ECC information, optionally with the ECC corrected data, from the memory device in sequence.

The second read command is "ECC Random Data Output" that includes a first cycle 0DH and a second cycle E8H. In operation, the memory controller sends the first cycle 0DH of the second read command to the memory device, the column address, and the second cycle E8H, in order. When the memory device becomes ready after confirming the second cycle E8H, the memory controller can randomly read out the ECC information, optionally with the ECC corrected data, within a page from the memory device.

The third read command is "ECC Cache Read Begin" in conjunction with "ECC Cache Read End." The "ECC Cache Read Begin" command includes a first cycle 08H and a second cycle 39H. The "ECC Cache Read End" command includes a first cycle 3CH without a second cycle. In operation, the memory controller sends the first cycle 08H to the memory device, the row and column addresses for start page selection, and the second cycle 39H, in order. When the memory device becomes ready after confirming the second cycle 39H, the memory controller can read out the ECC information, optionally with the ECC corrected data, from the memory device in sequence for multiple pages. The memory controller sends the first cycle 3CH of the "ECC Cache Read End" command to end the ECC cache read operation.

Figure 8:
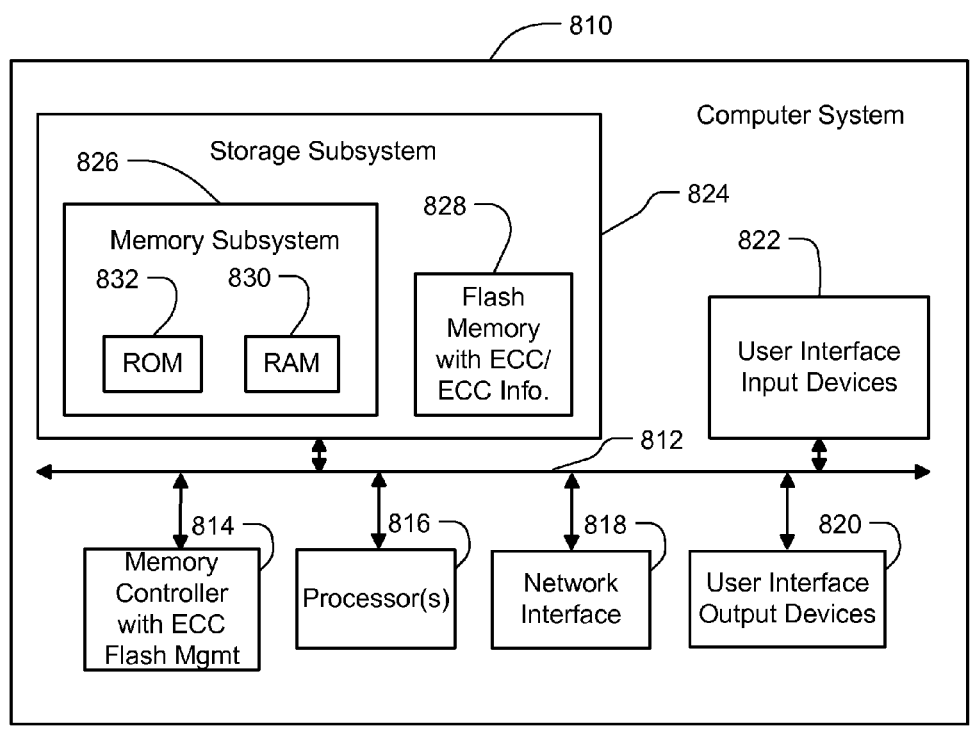
FIG. 8 is a block diagram of an example computer system.

FIG. 8 is a block diagram of an example computer system, according to one implementation. Computer system 810 typically includes at least one processor 816 which communicates with a number of peripheral devices via bus subsystem 812. These peripheral devices may include a storage subsystem 824 including, for example, memory devices and a flash memory with ECC/ECC information 828, user interface input devices 822, user interface output devices 820, and a network interface subsystem 818. The input and output devices allow user interaction with computer system 810. Network interface subsystem 818 provides an interface to outside networks.

User interface input devices 822 may include a keyboard; pointing devices such as a mouse, trackball, touchpad, or graphics tablet; a scanner; a touchscreen incorporated into the display; audio input devices such as voice recognition systems and microphones; and other types of input devices. In general, use of the term "input device" is intended to include all possible types of devices and ways to input information into computer system 810.

User interface output devices 820 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide a non-visual display such as via audio output devices. In general, use of the term "output device" is intended to include all possible types of devices and ways to output information from computer system 810 to the user or to another machine or computer system.

Storage subsystem 824 stores programming and data constructs that provide the functionality of some or all of the modules and methods described herein. These software modules are generally executed by processor 816 alone or in combination with other processors.

Memory 826 used in the storage subsystem 824 can include a number of memories including a main random access memory (RAM) 830 for storage of instructions and data during program execution and a read only memory (ROM) 832 in which fixed instructions are stored. The storage subsystem 824 can provide persistent storage for program and data files, and may include a hard disk drive, a floppy disk drive along with associated removable media, a CD-ROM drive, an optical drive, or removable media cartridges. The modules implementing the functionality of certain implementations may be stored in the storage subsystem 824, or in other machines accessible by the processor.

The computer system 810 may include a memory controller with ECC flash management 814, which includes programs or other logic that use an extended command set. The extended command set includes a command to request ECC corrected data from the flash memory with ECC/ECC information 828, along with ECC information such as a count of the number of corrected errors in the data being read. The flash memory with ECC/ECC information 828 provides ECC corrected data along with the requested ECC information to the memory controller with ECC flash management 814 in response to the command. Consequently, the memory controller with ECC flash management 814 is enabled to use the ECC information to perform memory management functions such as bad block management, re-mapping, refreshing, and wear leveling, using the ECC information. To support the extended command set, the flash memory with ECC/ECC information 828 includes logic to monitor ECC logic functions and gather ECC information, such as error counts or other statistics, to be used by the memory controller with ECC flash management 814.

Bus subsystem 812 provides a mechanism for letting the various components and subsystems of computer system 810 communicate with each other as intended. Although bus subsystem 812 is shown schematically as a single bus, alternative implementations of the bus subsystem may use multiple busses.

Computer system 810 can be of varying types including a workstation, server, computing cluster, blade server, server farm, or any other data processing system or computing device. Due to the ever-changing nature of computers and networks, the description of computer system 810 depicted in FIG. 8 is intended only as one example. Many other configurations of computer system 810 are possible having more or fewer components than the computer system depicted in FIG. 8.

Figure 9:
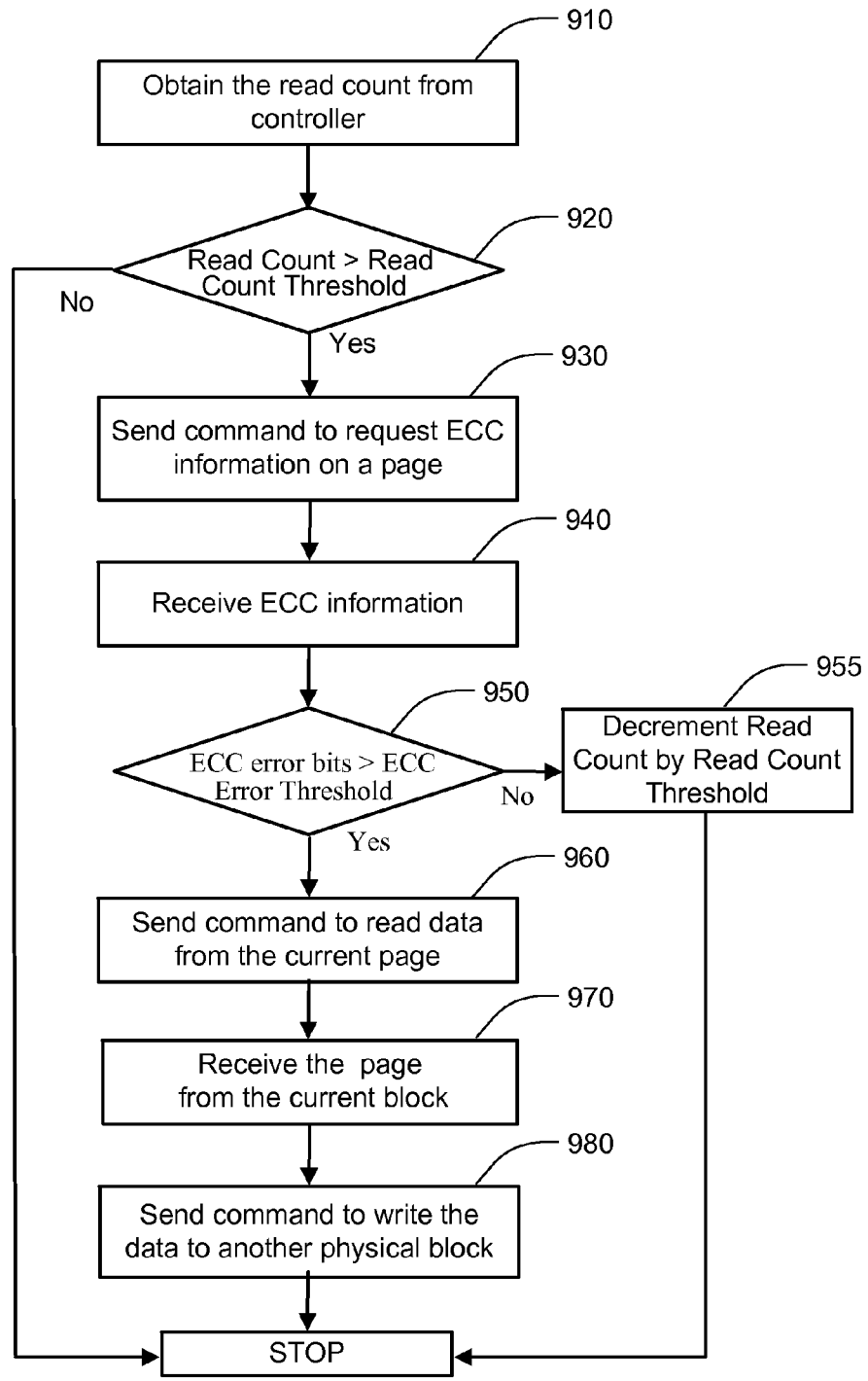
FIG. 9 is a flow chart illustrating management of read disturbance using ECC information.

FIG. 9 is a flow chart illustrating management of read disturbance using ECC information. A memory device includes blocks of pages of data. Read disturbance occurs when repeated reading of data on certain pages in a block causes data loss in unselected pages in the same block. A host system, such as the host system 212 described in connection with FIG. 2 or FIG. 3, controls the flow for managing read disturbance using ECC information. At Step 910, the flow obtains the read count on a particular page. At Step 920, the flow compares the obtained read count against a read count threshold. At Step 930, if the read count exceeds the read count threshold, the flow sends a command to the memory device requesting ECC information corresponding to the page. At Step 940, the flow receives the ECC information from the memory device in response to the command. For example, the ECC information may include the number of ECC corrected error bits in the page. At Step 950, the flow compares the received number of ECC corrected error bits against an ECC error threshold. At Step 955, if the number of ECC corrected error bits is less than the ECC error threshold, the read count for the page is decremented by the read count threshold. If the number of ECC corrected error bits is greater than the ECC error threshold, the flow then executes a refresh process on the page by copying the data on the page to a different physical location. At Step 960, the flow sends a command to read data from the current page. At Step 970, the flow receives the page from the current block. At Step 980, the flow sends a command to the memory device to write the data to another physical block of the memory device. The flow may be repeated for each page in the memory device during operation.

The present application provides a method of operating a memory device storing error correcting codes ECCs for corresponding data and including ECC logic to correct errors using the ECCs. The method comprises correcting data using ECCs for the data on the memory device, producing information on the memory device about the use of the ECCs, and providing ECC information on an output port of the device in response to a command received on an input port from a process external to the memory device. The input port includes circuits receiving input signals from an external controller.

These and additional implementations can include one or more of the following features. In some implementations, the method includes providing the ECC corrected data on the output port of the device in addition to the ECC information. The method includes performing the correcting data and the producing information in response to the command.

The ECCs are associated with corresponding ECC pages of data, and the ECC information comprises a count of the number of bits corrected using the ECC for a corresponding ECC page. The ECC information may include ECC statistics about results from executing the ECC logic using the ECCs on corresponding data.

The command may be a read command for reading a block of data associated with at least one ECC for detecting and correcting errors in the block of data. The command may be a read command for reading multiple blocks of data each associated with at least one error correcting code ECC for detecting and correcting errors in the associated block of data.

The method may further include storing ECC information in a register on the memory device. The command may be a read command for reading the ECC information in the register.

The present application also provides a method of controlling a memory device. The method includes sending a command to the memory device requesting ECC information corresponding to data in the memory device, where the memory device stores error correcting codes ECCs for the corresponding data and includes ECC logic to correct errors using the ECCs. The method includes receiving the ECC information from the memory device in response to the command, and performing a memory management function using the ECC information.

These and additional implementations can include one or more of the following features. In some implementations, the method includes receiving ECC corrected data in addition to the ECC information. The ECC information may include ECC statistics about results from executing the ECC logic using ECCs on corresponding data.

The command may be a read command for reading a block of data associated with at least one error correcting code ECC for detecting and correcting errors in the block of data. The command may be a read command for reading multiple blocks of data each associated with at least one error correcting code ECC for detecting and correcting errors in the associated block of data.

The method may be implemented in a separate integrated circuit in communication with the memory device. The method may be implemented using a computer program executed by a processor in communication with the memory device.

The memory management function may include mapping physical addresses of the memory device to logical addresses used by an operation system of a host processor, copying data at a range of logical addresses from a first range of physical addresses to a second range of physical addresses, marking blocks of data with numbers of error bits, detecting blocks of data with numbers of error bits greater than a threshold, and/or selecting a block for writing data.

The present application provides a memory device including a memory array, ECC logic, and control logic. The memory array stores data and error correcting codes ECCs for corresponding data. The ECC logic is configured to detect and correct errors in the corresponding data using the ECCs. The control logic is coupled to the memory array and the ECC logic to provide ECC information for corresponding data on an output port of the memory device in response to a command on an input port of the device. The input port includes circuits receiving input signals from an external controller.

These and additional implementations can include one or more of the following features. In some implementations, the control logic may provide ECC corrected data on the output port of the device in addition to the ECC information, where the output port includes circuits transmitting output signals including the ECC information and the ECC corrected data. The control logic may enable the ECC logic to produce corrected data in addition to the ECC information in response to the command.

The ECCs are associated with corresponding ECC pages of data, and a block of data is associated with at least one error correcting code ECC. The ECC information comprises a count of the number of bits corrected using the ECC for a corresponding ECC page. The ECC information may include ECC statistics about results from executing the ECC logic using the ECCs on corresponding data.

The command may be a read command for reading a block of data associated with at least one ECC for detecting and correcting errors in the block of data. The command may be a read command for reading multiple blocks of data each associated with at least one error correcting code ECC for detecting and correcting errors in the associated block of data.

The control logic may further include logic to store ECC information in a register on the memory device. The command may be a read command for reading the ECC information in the register.

The present application provides a memory controller including logic to send a command to a memory device requesting ECC information corresponding to data in the memory device, logic to receive the ECC information from the memory device in response to the command, logic to perform a memory management function using the ECC information, and logic to apply a command set including the command.

These and additional implementations can include one or more of the following features. In some implementations, the memory controller includes logic to receive ECC corrected data in addition to the ECC information. The ECC information may include ECC statistics about results from executing the ECC logic using ECCs on corresponding data.

The command may be a read command for reading a block of data associated with at least one error correcting code ECC available for detecting and correcting errors in the block of data. The command may be a read command for reading multiple blocks of data each associated with at least one error correcting code ECC available for detecting and correcting errors in the block of data.

The memory controller may be implemented in a separate integrated circuit in communication with the memory device. The memory controller may be implemented using a computer program executed by a processor in communication with the memory device.

The memory management function may include mapping physical addresses of the memory device to logical addresses used by an operation system of a host processor, copying data at a range of logical addresses from a first range of physical addresses to a second range of physical addresses, marking blocks of data with numbers of error bits, detecting blocks of data with numbers of error bits greater than a threshold, and selecting a block for writing data.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of operating a single integrated circuit storing error correcting codes ECCs for corresponding data and including ECC logic to correct errors using the ECCs, comprising:
    correcting data using ECCs for the data using circuitry on the single integrated circuit including a memory array storing the data and the ECCs at addresses received by the single integrated circuit from a process external to the single integrated circuit;
    producing ECC information using circuitry on the single integrated circuit about the use of the ECCs; and
    providing the ECC information on an output port of the single integrated circuit in response to a command received on an input port of the single integrated circuit from the process external to the single integrated circuit;
    wherein the ECC information includes ECC statistics about results from executing the ECC logic using ECCs on corresponding data.

2. The method of claim 1, including providing the ECC corrected data on the output port of the single integrated circuit in addition to the ECC information.

3. The method of claim 1, wherein the ECCs are associated with corresponding ECC pages of data, and the ECC information comprises a count of the number of bits corrected using the ECC for a corresponding ECC page.

4. The method of claim 1, wherein the command is a read command for reading at least a block of data each associated with at least one error correcting code ECC for detecting and correcting errors in the associated block of data.

5. A method of controlling a single integrated circuit, including:
    sending a command to the single integrated circuit from a process external to the single integrated circuit requesting ECC information corresponding to data in the single integrated circuit, the single integrated circuit including a memory array storing the data and error correcting codes ECCs for the corresponding data at addresses received by the single integrated circuit from the process and including ECC logic to correct errors using the ECCs and to produce the ECC information;
    receiving the ECC information from the single integrated circuit in response to the command; and
    performing a memory management function using the ECC information;
    wherein the ECC information includes ECC statistics about results from executing the ECC logic using ECCs on corresponding data.

6. The method of claim 5, including receiving ECC corrected data in addition to the ECC information.

7. The method of claim 5, wherein the command is a read command for reading a block of data associated with at least one error correcting code ECC for detecting and correcting errors in the block of data.

8. The method of claim 5, wherein the method is implemented using a computer program executed by a processor in communication with the single integrated circuit.

9. The method of claim 5, wherein the memory management function includes detecting blocks of data with numbers of error bits greater than a threshold.

10. A single integrated circuit including:
    a memory array storing data and error correcting codes ECCs for corresponding data at addresses received by the single integrated circuit from a process external to the single integrated circuit;
    ECC logic to detect and correct errors in the corresponding data using the ECCs; and control logic coupled to the memory array and the ECC logic to provide ECC information for corresponding data on an output port of the integrated circuit in response to a command received on an input port of the integrated circuit from the process external to the integrated circuit;

wherein the ECC information includes ECC statistics about results from executing the ECC logic using ECCs on corresponding data.

11. The single integrated circuit of claim 10, wherein the control logic provides ECC corrected data on the output port of the single integrated circuit in addition to the ECC information, wherein the output port includes circuits transmitting output signals including the ECC information and the ECC corrected data.

12. The integrated circuit of claim 10, wherein the ECCs are associated with corresponding ECC pages of data, and the ECC information comprises a count of the number of bits corrected using the ECC for a corresponding ECC page.

13. The integrated circuit of claim 10, wherein the command is a read command for reading at least a block of data each associated with at least one error correcting code ECC for detecting and correcting errors in the associated block of data.

14. A memory controller including control logic in logic circuitry configured to perform operations including:

sending a command to a single integrated circuit requesting ECC information corresponding to data in the single integrated circuit, the single integrated circuit including a memory array storing the data and error correcting codes ECCs for the corresponding data at addresses received by the single integrated circuit from the memory controller and including ECC logic to correct errors using the ECCs and to produce the ECC information;

receiving the ECC information from the single integrated circuit in response to the command;

performing a memory management function using the ECC information; and applying a command set including the command;

wherein the ECC information includes ECC statistics about results from executing ECC logic in the single integrated circuit using ECCs on corresponding data.

15. The memory controller of claim 14, wherein the operations further include receiving ECC corrected data in addition to the ECC information.

16. The memory controller of claim 14, wherein the command is a read command for reading at least a block of data each associated with at least one error correcting code ECC available for detecting and correcting errors in the block of data.

17. The memory controller of claim 14, wherein the memory controller is implemented using a computer program executed by a processor in communication with the single integrated circuit.

18. The memory controller of claim 14, wherein the memory management function includes detecting blocks of data with numbers of error bits greater than a threshold.

* * * * *